(12) United States Patent
Zeng

(10) Patent No.: US 10,838,294 B2
(45) Date of Patent: Nov. 17, 2020

(54) METHOD FOR IMPROVING RESIDUAL TITO ON THE PERIPHERY OF PANEL AND MASK

(71) Applicant: Wuhan China Star Optoelectronics Technology Co., Ltd., Wuhan (CN)

(72) Inventor: Shuanghua Zeng, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 229 days.

(21) Appl. No.: 15/740,907

(22) PCT Filed: Nov. 21, 2017

(86) PCT No.: PCT/CN2017/112054
§ 371 (c)(1),
(2) Date: Sep. 13, 2018

(87) PCT Pub. No.: WO2019/085050
PCT Pub. Date: May 9, 2019

(65) Prior Publication Data
US 2019/0384159 A1    Dec. 19, 2019

(30) Foreign Application Priority Data
Oct. 31, 2017  (CN) .......................... 2017 1 1043810

(51) Int. Cl.
*G03F 7/20* (2006.01)
*G02F 1/1333* (2006.01)
(Continued)

(52) U.S. Cl.
CPC .............. *G03F 1/38* (2013.01); *G02F 1/1303* (2013.01); *G02F 1/1333* (2013.01); *G03F 7/20* (2013.01);
(Continued)

(58) Field of Classification Search
CPC ............. G02F 1/1333; G02F 1/133345; G02F 1/13439; G02F 1/1303;
(Continued)

(56) References Cited

U.S. PATENT DOCUMENTS

2008/0055503 A1* 3/2008 Cheng ................... G02F 1/1368
349/38
2009/0280606 A1* 11/2009 Shih ....................... H01L 31/095
438/155
(Continued)

FOREIGN PATENT DOCUMENTS

| CN | 104952792 | * | 9/2015 | ......... H01L 27/1225 |
| CN | 105068336 | * | 11/2015 | ........... G02F 1/0063 |
| CN | 105068373 A |   | 11/2015 |                        |

OTHER PUBLICATIONS

Machine translation of CN 105068373 (2015).*
Machine translation of CN 105068336 (2015).*
Machine translation of CN 104952792 (2015).*

*Primary Examiner* — Martin J Angebranndt
(74) *Attorney, Agent, or Firm* — Hemisphere Law, PLLC; Zhigang Ma

(57) ABSTRACT

The application provides a mask disposed above a panel; the panel includes a planarization layer, and the planarization layer includes a plurality of trenches, the planarization layer is coated with a layer of TITO; the mask is provided with transparent regions, semi-transparent regions and opaque regions; the transparent regions are respectively arranged on the periphery of the display area and the semi-transparent regions are respectively arranged on the area directly above the trenches on the periphery of the display area; the opaque regions are respectively disposed directly above on each place other than the trenches of the panel, the transparent regions guide the light to expose and remove the TITO in the trenches on the periphery of the display area, the semi-
(Continued)

transparent regions weaken the light and exposes and removes the TITO in trenches of the display area, the opaque regions block the light to avoid the exposure of TITO.

14 Claims, 2 Drawing Sheets

(51) Int. Cl.
*G02F 1/13357* (2006.01)
*G02F 1/13* (2006.01)
*G03F 1/38* (2012.01)

(52) U.S. Cl.
CPC ............ *G02F 2001/133357* (2013.01); *G02F 2202/22* (2013.01)

(58) Field of Classification Search
CPC ..... G02F 2001/133357; G02F 2202/22; H01L 21/77; G03F 1/50; G03F 1/38; G03F 7/20
See application file for complete search history.

(56) References Cited

U.S. PATENT DOCUMENTS

| | | | |
|---|---|---|---|
| 2014/0014979 A1* | 1/2014 | Matsumoto | H01L 33/0041 257/88 |
| 2017/0018579 A1* | 1/2017 | Lv | H01L 29/78636 |
| 2018/0157106 A1* | 6/2018 | Ming | G02F 1/133621 |

* cited by examiner

| Selecting a panel; wherein, the panel is provided with a planarization layer, and the planarization layer is etched with a plurality of trenches with a plurality of upward openings, and a layer of top indium tin oxide is applied on the planarization layer | S1 |

↓

| Disposing a mask above the selected panel, providing a transparent region, a semi-transparent region and an opaque region on the mask, and respectively disposing the transparent regions directly above each of the trenches on the planarization layer corresponding to the periphery of the display panel, respectively disposing the semi-transparent regions directly above each of the trenches on the planarization layer corresponding to the display region of the panel; and respectively disposing the opaque regions directly above on each place other than the plurality of trenches on the planarization layer corresponding to the display area of the panel and the periphery of the display area. | S2 |

↓

| Exposing the selected panel through the mask with light having a predetermined light intensity, so that the transparent region directly guides the light having the predetermined light intensity to expose and remove the top indium tin oxide in each of the trenches on the planarization layer corresponding to the periphery of the display area of the panel; the semi-transparent region weakens the intensity of the light having the predetermined light intensity to a certain extent and then exposes and removes the top indium tin oxide in each trenches on the planarization layer corresponding to the display area of the clean panel; and the opaque regions block the light having the predetermined light intensity to avoid the exposure of the top indium tin oxide except each of the plurality of trenches on the planarization layers corresponding to the display area and the periphery of the panel. | S3 |

FIG. 4

METHOD FOR IMPROVING RESIDUAL TITO ON THE PERIPHERY OF PANEL AND MASK

RELATED APPLICATIONS

The present application is a National Phase of International Application Number PCT/CN2017/112054, filed Nov. 21, 2017, and claims the priority of China Application CN 201711043810.5, filed Oct. 31, 2017.

FIELD OF THE DISCLOSURE

The disclosure relates to a liquid crystal display technical field, and more particularly to a method for improving residual top indium tin oxide, TITO on the periphery of a panel and a mask.

BACKGROUND

As shown in FIG. 1 and FIG. 2, in the process of fabricating a panel by using low temperature poly-silicon, LTPS device, the mask 1' is disposed above the panel 2', the mask 1' is designed to be transparent region 11' in a region to be etched corresponding to the display region A' and its periphery B' of the panel 2', and the region not to be etched is remained as the opaque region 13', however, since the area on the periphery B' around the of the display area of the panel 2' needs to be exposed is larger, the phenomenon of the difference exposure degree is happened because of the inconsistent pattern density of the display area A' and the periphery B' of the of the panel, therefore, part of the residual photoresist is formed in the trench L' of the planarization layer 21' corresponding to the periphery B' of the display area of the panel, therefore, during the wet etching of TITO, the layer under the photoresist cannot be completed etched, to make TITO 22' residual on the peripheral of the substrate, shortening the distance from the cutting line to the periphery of the panel around the anti-static line M', and reducing the antistatic ability.

SUMMARY

The technical problem to be solved in the embodiments of the present application is to provide a method for improving residual TITO on the periphery of the panel and a mask, to improve the residual TITO phenomenon on the peripheral region of the panel, so as to improve reliability such as antistatic ability.

In order to solve the above technical problem, an embodiment of the present application provides a mask disposed above a panel, wherein the panel includes a planarization layer, the planarization layer is etched to form a plurality of trenches with upward openings, and a layer of top indium tin oxide is applied on the planarization layer;

Wherein, the mask includes transparent regions, semi-transparent regions and opaque regions;

Wherein, the transparent regions are respectively disposed directly above each of the trenches on the planarization layer corresponding to the periphery of the display panel;

Wherein, the semi-transparent regions are respectively disposed directly above each of the trenches on the planarization layer corresponding to the display region of the panel;

Wherein, the opaque regions are respectively disposed directly above on each place other than the plurality of trenches on the planarization layer corresponding to the display area of the panel and the periphery of the display area; and Wherein, the transparent regions directly guide the light having the predetermined light intensity to expose and remove the top indium tin oxide in each of the trenches on the planarization layer corresponding to the periphery of the display area of the panel, the semi-transparent regions weaken the intensity of the light having the predetermined light intensity to a certain extent and then exposes and removes the top indium tin oxide in each trenches on the planarization layer corresponding to the display area of the panel, and the opaque regions block the light having the predetermined light intensity to avoid the exposure of the top indium tin oxide except each of the plurality of trenches on the planarization layers corresponding to the display area and the periphery of the panel.

Wherein outer boundaries of each of the trenches of the planarization layer are all in the shape of an inverted trapezoid or an inverted triangle, and diameters of the openings at the top of each trenches of the planarization layer are larger than the diameters of the bottom openings.

Wherein lengths of the transparent regions are equal to the diameters of the openings of the corresponding trenches in the peripheral of the display area toward one end of the mask.

Wherein lengths of the semi-transparent regions are equal to the diameters of the opening of the corresponding trenches in the display region toward one end of the mask.

Wherein lengths of the opaque regions are equal to lengths of the corresponding each place except each of the plurality of trenches on the planarization layer.

Accordingly, the embodiment of the present application further provides another mask disposed above a panel, wherein the panel includes a planarization layer, the planarization layer is etched to form a plurality of trenches with upward openings, and a layer of top indium tin oxide is applied on the planarization layer;

Wherein, the mask includes a transparent region, a semi-transparent region and an opaque region;

Wherein, the transparent regions are respectively disposed directly above each of the trenches on the planarization layer corresponding to the periphery of the display panel;

Wherein, the semi-transparent regions are respectively disposed directly above each of the trenches on the planarization layer corresponding to the display region of the panel;

Wherein, the opaque regions are respectively disposed directly above on each place other than the plurality of trenches on the planarization layer corresponding to the display area of the panel and the periphery of the display area;

Wherein, the transparent regions directly guide the light having the predetermined light intensity to expose and remove the top indium tin oxide in each of the trenches on the planarization layer corresponding to the periphery of the display area of the panel, the semi-transparent regions weaken the intensity of the light having the predetermined light intensity to a certain extent and then exposes and removes the top indium tin oxide in each trenches on the planarization layer corresponding to the display area of the panel, and the opaque regions block the light having the predetermined light intensity to avoid the exposure of the top indium tin oxide except each of the plurality of trenches on the planarization layers corresponding to the display area and the periphery of the panel; and Wherein lengths of the transparent regions are equal to the diameters of the openings of the corresponding trenches in the peripheral of the display area toward one end of the mask.

Wherein outer boundaries of each of the trenches of the planarization layer are all in the shape of an inverted trapezoid or an inverted triangle, and diameters of the openings at the top of each trenches of the planarization layer are larger than the diameters of the bottom openings.

Wherein lengths of the semi-transparent regions are equal to the diameters of the opening of the corresponding trenches in the display region toward one end of the mask.

Wherein lengths of the opaque regions are equal to lengths of the corresponding each place except each of the plurality of trenches on the planarization layer.

Accordingly, the embodiment of the present application further provides a method for improving residual TITO in a periphery of a panel, including:

Selecting a panel, wherein the panel includes a planarization layer, the planarization layer is etched with a plurality of trenches with a plurality of upward openings, and a layer of top indium tin oxide is applied on the planarization layer;

Disposing a mask above the selected panel, the mask includes transparent regions, semi-transparent regions and opaque regions, respectively disposing the transparent regions directly above each of the trenches on the planarization layer corresponding to the periphery of the display panel, respectively disposing the semi-transparent regions directly above each of the trenches on the planarization layer corresponding to the display region of the panel; and respectively disposing the opaque regions directly above on each place other than the plurality of trenches on the planarization layer corresponding to the display area of the panel and the periphery of the display area; and Exposing the selected panel through the mask with light having a predetermined light intensity, so that the transparent region directly guiding the light having the predetermined light intensity to expose and remove the top indium tin oxide in each of the trenches on the planarization layer corresponding to the periphery of the display area of the panel; the semi-transparent region weakening the intensity of the light having the predetermined light intensity to a certain extent and then exposing and removing the top indium tin oxide in each trenches on the planarization layer corresponding to the display area of the clean panel; and the opaque regions blocking the light having the predetermined light intensity to avoid the exposure of the top indium tin oxide except each of the plurality of trenches on the planarization layers corresponding to the display area and the periphery of the panel.

Wherein outer boundaries of each of the trenches of the planarization layer are all in the shape of an inverted trapezoid or an inverted triangle, and diameters of the openings at the top of each trenches of the planarization layer are larger than the diameters of the bottom openings.

Wherein lengths of the transparent regions are equal to the diameters of the openings of the corresponding trenches in the peripheral of the display area toward one end of the mask.

Wherein lengths of the semi-transparent regions are equal to the diameters of the opening of the corresponding trenches in the display region toward one end of the mask.

Wherein lengths of the opaque regions are equal to lengths of the corresponding each place except each of the plurality of trenches on the planarization layer.

Compared with the conventional mask, in the present application, the transparent region above the trenches corresponding to the display area of the panel in the conventional mask is completely changed into the semi-transparent region, so that under the condition of enhanced exposure intensity, not only the TITO in each trench of the planarization layer corresponding to the periphery of the display area is exposed and completely removed, but also not affecting the non-exposure range exposure of the display area of the panel (that is not expose the TITO on the panel corresponding to the opaque area of the mask), thereby improving the residual TITO in the peripheral of the panel, thereby improving the reliability such as antistatic ability and the like, but also does not affect the original exposure and exposure range of the panel display area.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the FIG.s:

FIG. 4 is a flowchart of a method for improving residual TITO on the periphery of the panel provided in a second embodiment of the present application.

DETAILED DESCRIPTION OF PREFERRED EMBODIMENTS

The preferred embodiments of the present application are described below with reference to the accompanying drawings.

Figure 1:
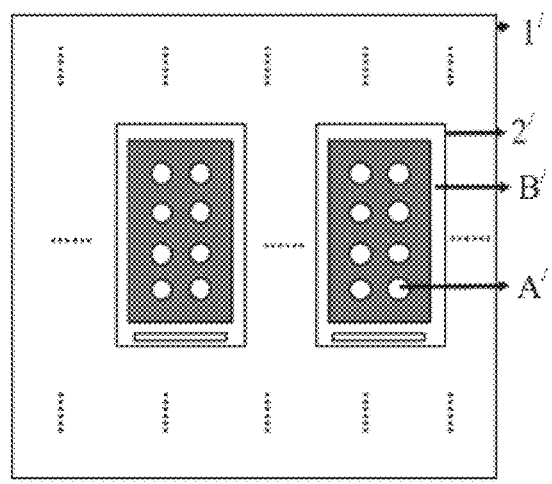
FIG. 1 is a top plan view of a combination of a mask and a panel in the conventional technology.
Figure 2:
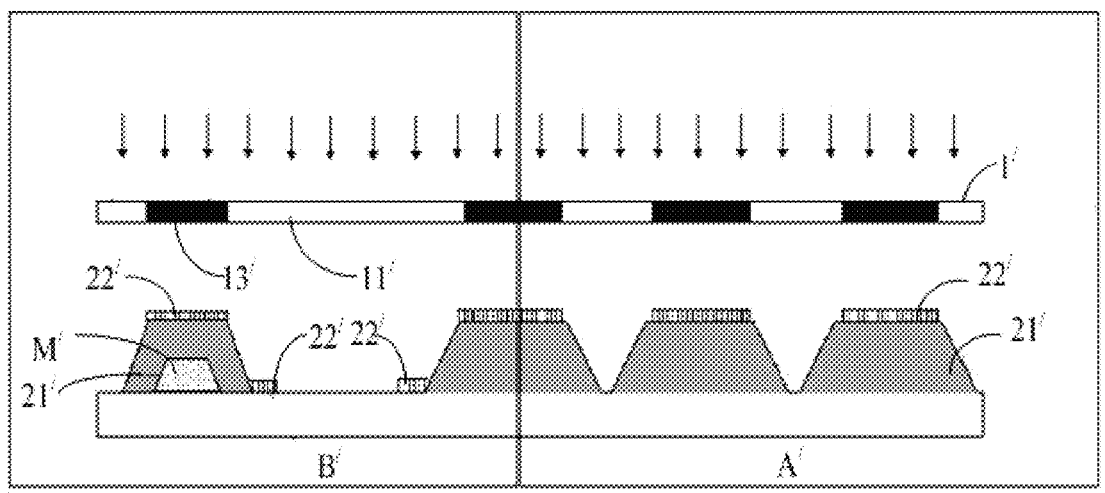
FIG. 2 is a partial cross-sectional view of FIG. 1.
Figure 3:
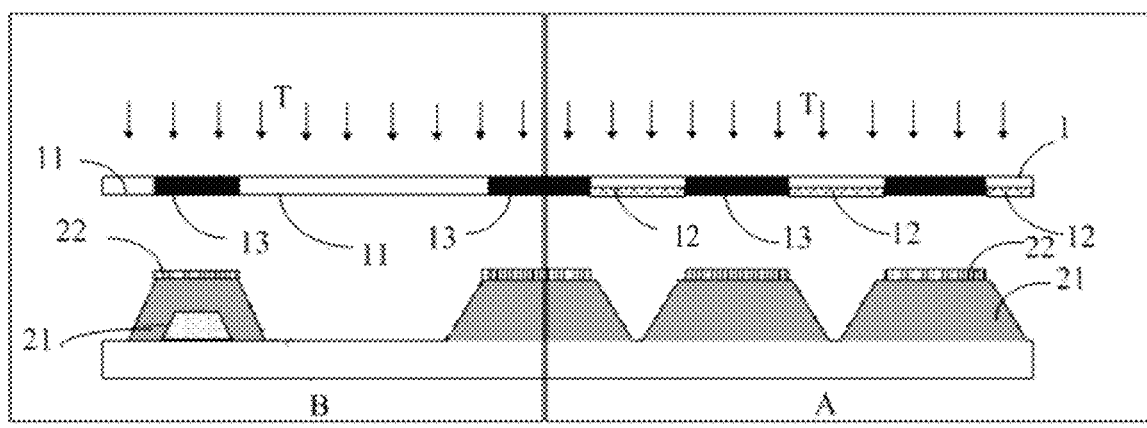
FIG. 3 is a partial cross-sectional view of a combination of a mask and a panel according to a first embodiment of the present application.

As shown in FIG. 3, in the first embodiment of the present application, a mask 1 is provided disposed above a panel 2, wherein the panel 2 is provided with a planarization layer 21, and the planarization layer 21 is etched to form a plurality of trenches L with upward openings, and a layer of top indium tin oxide is applied on the planarization layer;

Wherein, the mask 1 is provided with transparent regions 11, semi-transparent regions 12 and opaque regions 13; wherein, The transparent regions 11 are respectively disposed directly above each of the trenches L on the planarization layer 21 corresponding to the periphery B of the display panel 2

The semi-transparent regions 12 are respectively disposed directly above each of the trenches L on the planarization layer 21 corresponding to the display region A of the panel 2;

The opaque regions 13 are respectively disposed directly above on each place other than the plurality of trenches L on the planarization layer 21 corresponding to the display area A of the panel 2 and the periphery of the display area B;

Wherein, the transparent regions 11 directly guide the light T having the predetermined light intensity to expose and remove the top indium tin oxide in each of the trenches L on the planarization layer 21 corresponding to the periphery of the display area B of the panel 2; the semi-transparent regions 12 weaken the intensity of the light T having the predetermined light intensity to a certain extent and then exposes and removes the top indium tin oxide in each trenches L on the planarization layer 21 corresponding to the display area A of the clean panel 2; the opaque regions 13 block the light T having the predetermined light intensity to avoid the exposure of the top indium tin oxide 22 except each of the plurality of trenches L on the planarization layers 21 corresponding to the display area A and the periphery B of the panel 2.

It can be understood that, the mask 1 in the first embodiment of the present application adopts a completely transparent design at the periphery of the display area B of the panel 2, so that the display area A needs more light intensity for totally removing the photoresist on the top indium tin oxide, and also increases the light intensity of the circuit around the panel, the photoresist on the top indium tin oxide in the trenches L of the planarization layer 21 in the periphery of the panel can be totally removed. It should be noted that, since the mask 1 in the first embodiment of the present application adopts the semi-transparent design in the display area A of the panel 2, it is mainly to avoid the light T with increased light intensity can automatically reduce the intensity, so that the light T has a transition effect of the intensity in the display area A of the panel 2, without affecting the exposure of the top indium tin oxide in the display region A of the panel 2 corresponds to the opaque region 13, that is the degree of exposure of the top indium tin oxide in the display area A of the panel 2 is maintained by the conventional photomask.

It can be understood that, in the first embodiment of the present application, the mask 1 is made of opaque material. First, the transparent region 11, the semi-transparent region 12 and the opaque region 13 are determined, and then the transparent region 11 and the semi-transparent region 12 are all etched to form the transparent region 11 by an etching process, and then the semi-transparent region 12 is selected to form a film with the semi-transparent material. Then, the remaining region is formed as the opaque region 13.

In order to better and completely expose the top indium tin oxide corresponding to the transparent region 11 in the periphery of the display region B and the semi-transparent region 12 in the display region A, the outer boundaries of each of the trenches L of the planarization layer 21 are all in the shape of an inverted trapezoid or an inverted triangle, and the diameters of the openings at the top of each trenches L of the planarization layer 21 are larger than the diameters of the bottom openings thereof, so that the light T with a predetermined intensity can completely irradiate everywhere of each trenches L of the planarization layer 21. Of course, if outer boundaries of each trenches L of the flat layer 21 has a large trapezoidal shape or a triangular shape with a small upper surface and a large bottom surface, there is a possibility that a part of the top indium tin oxide at the bottom of the trenches L cannot be exposed.

In order to reduce the exposure of the top indium tin oxide corresponding to the opaque region 13 in the periphery of the display region B, and also complete exposure of the top indium tin oxide of each trench L in the transparent region 11 in the periphery of the display region B, therefore, lengths of the transparent regions 11 are equal to the diameters of the openings of the corresponding trenches L in the peripheral of the display area B toward one end of the mask, so as to achieve the best exposure effect.

Similarly, in order to reduce the exposure of the top indium tin oxide corresponding to the opaque region 13 of the display region A, and also complete exposure of the top indium tin oxide of each trench L of each of the trenches L in the semi-transparent region 12 of the display region, therefore, lengths of the semi-transparent region 12 are equal to the diameters of the openings of the corresponding trenches L in the display region A toward one end of the mask.

Similarly, in order to avoid the exposure of the top indium tin oxide corresponding to the opaque region 13 in the display area A and the peripheral of the display area B, and also complete exposure of the top indium tin oxide of each trench L of each of the trenches L in the semi-transparent region 12 of the display area A and in the transparent region 11 on the periphery in the display area B, therefore lengths of the opaque regions 13 are equal to lengths of the corresponding each place except each of the plurality of trenches L on the planarization layer 21.

As shown in FIG. 4, a method for improving residual TITO in a periphery of a panel according to a second embodiment of the present application is provided. The method includes:

Step S1, selecting a panel; wherein, the panel is provided with a planarization layer, and the planarization layer is etched with a plurality of trenches with a plurality of upward openings, and a layer of top indium tin oxide is applied on the planarization layer;

Step S2, disposing a mask above the selected panel, providing a transparent region, a semi-transparent region and an opaque region on the mask, and respectively disposing the transparent regions directly above each of the trenches on the planarization layer corresponding to the periphery of the display panel, respectively disposing the semi-transparent regions directly above each of the trenches on the planarization layer corresponding to the display region of the panel; and respectively disposing the opaque regions directly above on each place other than the plurality of trenches on the planarization layer corresponding to the display area of the panel and the periphery of the display area;

Step S3, exposing the selected panel through the mask with light having a predetermined light intensity, so that the transparent region directly guides the light having the predetermined light intensity to expose and remove the top indium tin oxide in each of the trenches on the planarization layer corresponding to the periphery of the display area of the panel; the semi-transparent region weakens the intensity of the light having the predetermined light intensity to a certain extent and then exposes and removes the top indium tin oxide in each trenches on the planarization layer corresponding to the display area of the clean panel; and the opaque regions block the light having the predetermined light intensity to avoid the exposure of the top indium tin oxide except each of the plurality of trenches on the planarization layers corresponding to the display area and the periphery of the panel.

Wherein, the outer boundaries of each of the trenches of the planarization layer are all in the shape of an inverted trapezoid or an inverted triangle, and the diameters of the openings at the top of each trenches of the planarization layer are larger than the diameters of the bottom openings.

Wherein lengths of the transparent regions are equal to the diameters of the openings of the corresponding trenches in the peripheral of the display area toward one end of the mask.

Wherein lengths of the semi-transparent regions are equal to the diameters of the opening of the corresponding trenches in the display region toward one end of the mask.

Wherein lengths of the opaque regions are equal to lengths of the corresponding each place except each of the plurality of trenches on the planarization layer.

To sum up, in contrast with the conventional mask, in the present application, the transparent region above the trenches corresponding to the display area of the panel in the conventional mask is completely changed into the semi-transparent region, so that under the condition of enhanced exposure intensity, not only the TITO in each trench of the planarization layer corresponding to the periphery of the display area is exposed and completely removed, but also not affecting the non-exposure range exposure of the display area of the panel (that is not expose the TITO on the panel corresponding to the opaque area of the mask), thereby improving the residual TITO in the peripheral of the panel, thereby improving the reliability such as antistatic ability and the like, but also does not affect the original exposure and exposure range of the panel display area.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A masked assembly comprising a mask disposed above a panel, wherein the panel comprises a planarization layer, the planarization layer is etched to form a plurality of trenches with upward openings, a layer of top indium tin oxide is applied on the planarization layer and in the plurality of trenches, and a photoresist is disposed on the layer of top indium tin oxide; the panel comprises a display area and a peripheral area at a periphery of the display area, and the peripheral area has an anti-static line located therein;
   wherein, the mask comprises transparent regions, semi-transparent regions and opaque regions;
   wherein, the transparent regions only are respectively disposed directly above each of the trenches on the planarization layer corresponding to the peripheral area;
   wherein, the semi-transparent regions only are respectively disposed directly above each of the trenches on the planarization layer corresponding to the display area;
   wherein, the opaque regions are respectively disposed directly above on each place other than the plurality of trenches on the planarization layer corresponding to the display area and the peripheral area; and
   wherein, the transparent regions directly guide the light having the predetermined light intensity to expose and completely remove the top indium tin oxide in each of the trenches on the planarization layer corresponding to the peripheral area, the semi-transparent regions weaken the intensity of the light having the predetermined light intensity to a certain extent and then exposes and completely removes the top indium tin oxide in each trenches on the planarization layer corresponding to the display area of the panel, and the opaque regions block the light having the predetermined light intensity to avoid the exposure of the top indium tin oxide except each of the plurality of trenches on the planarization layers corresponding to the display area and the peripheral area.

2. The masked assembly according to claim 1, wherein outer boundaries of each of the trenches of the planarization layer are all in the shape of an inverted trapezoid or an inverted triangle, and diameters of the openings at the top of each trenches of the planarization layer are larger than the diameters of the bottom openings.

3. The masked assembly according to claim 2, wherein lengths of the transparent regions are equal to the diameters of the openings of the corresponding trenches in the peripheral area toward one end of the mask.

4. The masked assembly according to claim 3, wherein lengths of the semi-transparent regions are equal to the diameters of the opening of the corresponding trenches in the display area toward one end of the mask.

5. The masked assembly according to claim 4, wherein lengths of the opaque regions are equal to lengths of the corresponding each place except each of the plurality of trenches on the planarization layer.

6. A masked assembly comprising a mask disposed above a panel, wherein the panel comprises a planarization layer, the planarization layer is etched to form a plurality of trenches with upward openings, a layer of top indium tin oxide is applied on the planarization layer and in the plurality of trenches, and a photoresist is disposed on the layer of top indium tin oxide; the panel comprises a display area and a peripheral area at a periphery of the display area;
   wherein, the mask comprises transparent regions, semi-transparent regions and opaque regions;
   wherein, the transparent regions are respectively disposed directly above each of the trenches on the planarization layer corresponding to the peripheral area;
   wherein, the semi-transparent regions are respectively disposed directly above each of the trenches on the planarization layer corresponding to the display area, and thereby the display area has no the semi-transparent region of the mask located therein and the peripheral area has no the transparent region of the mask located therein;
   wherein, the opaque regions are respectively disposed directly above on each place other than the plurality of trenches on the planarization layer corresponding to the display area and the peripheral area;
   wherein, the transparent regions directly guide the light having the predetermined light intensity to expose and completely remove the top indium tin oxide in each of the trenches on the planarization layer corresponding to the peripheral area, the semi-transparent regions weaken the intensity of the light having the predetermined light intensity to a certain extent and then exposes and completely removes the top indium tin oxide in each trenches on the planarization layer corresponding to the display area of the panel, and the opaque regions block the light having the predetermined light intensity to avoid the exposure of the top indium tin oxide except each of the plurality of trenches on the planarization layers corresponding to the display area and the peripheral area; and
   wherein lengths of the transparent regions are equal to the diameters of openings of the corresponding trenches in the peripheral area toward one end of the mask.

7. The masked assembly according to claim 6, wherein outer boundaries of each of the trenches of the planarization layer are all in the shape of an inverted trapezoid or an inverted triangle, and diameters of the openings at the top of each trenches of the planarization layer are larger than the diameters of the bottom openings.

8. The masked assembly according to claim 7, wherein lengths of the semi-transparent regions are equal to the diameters of the opening of the corresponding trenches in the display area toward one end of the mask.

9. The masked assembly according to claim 8, wherein lengths of the opaque regions are equal to lengths of the corresponding each place except each of the plurality of trenches on the planarization layer.

10. A method for improving residual top indium tin oxide layer in a peripheral area of a panel around a display area of the panel, comprising:

selecting a panel, wherein the panel comprises a planarization layer, the planarization layer is etched with a plurality of trenches with a plurality of upward openings, and a layer of top indium tin oxide is applied on the planarization layer and in the plurality of trenches, and a photoresist is disposed on the layer of top indium tin oxide;

disposing a mask above the selected panel, the mask comprises transparent regions, semi-transparent regions and opaque regions, respectively disposing only the transparent regions directly above each of the trenches on the planarization layer corresponding to the peripheral area, respectively disposing only the semi-transparent regions directly above each of the trenches on the planarization layer corresponding to the display area; and respectively disposing the opaque regions directly above on each place other than the plurality of trenches on the planarization layer corresponding to the display area and the peripheral area; and exposing the selected panel through the mask with light having a predetermined light intensity, so that the transparent region directly guiding the light having the predetermined light intensity to expose and completely remove the top indium tin oxide in each of the trenches on the planarization layer corresponding to the peripheral area; the semi-transparent region weakening the intensity of the light having the predetermined light intensity to a certain extent and then exposing and completely removing the top indium tin oxide in each trenches on the planarization layer corresponding to the display area of the clean panel; and the opaque regions blocking the light having the predetermined light intensity to avoid the exposure of the top indium tin oxide except each of the plurality of trenches on the planarization layers corresponding to the display area and the peripheral area.

11. The method according to claim 10, wherein outer boundaries of each of the trenches of the planarization layer are all in the shape of an inverted trapezoid or an inverted triangle, and diameters of the openings at the top of each trenches of the planarization layer are larger than the diameters of the bottom openings.

12. The method according to claim 11, wherein lengths of the transparent regions are equal to the diameters of the openings of the corresponding trenches in the peripheral area toward one end of the mask.

13. The method according to claim 12, wherein lengths of the semi-transparent regions are equal to the diameters of the opening of the corresponding trenches in the display area toward one end of the mask.

14. The method according to claim 13, wherein lengths of the opaque regions are equal to lengths of the corresponding each place except each of the plurality of trenches on the planarization layer.

* * * * *